(12) United States Patent
Yu et al.

(10) Patent No.: US 9,515,036 B2
(45) Date of Patent: Dec. 6, 2016

(54) METHODS AND APPARATUS FOR SOLDER CONNECTIONS

(75) Inventors: Chen-Hua Yu, Hsin-Chu (TW); Hao-Yi Tsai, Hsin-Chu (TW); Chien-Hsiun Lee, Chu-tung Town (TW); Chung-Shi Liu, Hsin-Chu (TW); Hsien-Wei Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 660 days.

(21) Appl. No.: 13/452,507

(22) Filed: Apr. 20, 2012

(65) Prior Publication Data
US 2013/0277838 A1 Oct. 24, 2013

(51) Int. Cl.
*H01L 23/00* (2006.01)

(52) U.S. Cl.
CPC ............ *H01L 24/11* (2013.01); *H01L 24/13* (2013.01); *H01L 24/14* (2013.01); *H01L 2224/0391* (2013.01); *H01L 2224/03464* (2013.01); *H01L 2224/0401* (2013.01); *H01L 2224/05008* (2013.01); *H01L 2224/05027* (2013.01); *H01L 2224/05562* (2013.01); *H01L 2224/05567* (2013.01); *H01L 2224/05572* (2013.01); *H01L 2224/05644* (2013.01); *H01L 2224/05655* (2013.01); *H01L 2224/05664* (2013.01); *H01L 2224/05669* (2013.01); *H01L 2224/1132* (2013.01); *H01L 2224/1134* (2013.01); *H01L 2224/11849* (2013.01); *H01L 2224/13022* (2013.01); *H01L 2224/13076* (2013.01); *H01L 2224/13078* (2013.01); *H01L 2224/13082* (2013.01); *H01L 2224/13144* (2013.01); *H01L 2224/13147* (2013.01); *H01L 2224/1403* (2013.01); *H01L 2224/14051* (2013.01);

(Continued)

(58) Field of Classification Search
CPC .......... H01L 24/00; H01L 24/10; H01L 24/01
See application file for complete search history.

(56) References Cited

U.S. PATENT DOCUMENTS

| 5,186,381 A | 2/1993 | Kim |
| 6,762,122 B2 | 7/2004 | Mis et al. |

(Continued)

FOREIGN PATENT DOCUMENTS

| DE | 41 31 413 A1 | 10/1992 |
| JP | 2000091371 A | 3/2000 |

(Continued)

OTHER PUBLICATIONS

Korean Office Action and English Translation, Patent Application No. 10-2012-0135543, Oct. 11, 2013, 13 pages.

*Primary Examiner* — Mohammad Choudhry
(74) *Attorney, Agent, or Firm* — Slater Matsil, LLP

(57) ABSTRACT

Methods and apparatus for solder connections. An apparatus includes a substrate having a conductive terminal on a surface; a passivation layer overlying the surface of the substrate and the conductive terminal; an opening in the passivation layer exposing a portion of the conductive terminal; at least one stud bump bonded to the conductive terminal in the opening and extending in a direction normal to the surface of the substrate; and a solder connection formed on the conductive terminal in the opening and enclosing the at least one stud bump. Methods for forming the solder connections are disclosed.

19 Claims, 16 Drawing Sheets

(52) U.S. Cl.
CPC ............... *H01L 2224/14131* (2013.01); *H01L 2224/16225* (2013.01); *H01L 2224/16227* (2013.01); *H01L 2924/00014* (2013.01); *H01L 2924/01322* (2013.01); *H01L 2924/351* (2013.01)

(56) References Cited

U.S. PATENT DOCUMENTS

| | | |
|---|---|---|
| 8,492,891 B2 | 7/2013 | Lu et al. |
| 2005/0090089 A1* | 4/2005 | Ma et al. ...................... 438/612 |
| 2005/0104222 A1* | 5/2005 | Jeong ...................... H01L 23/16 |
| | | 257/778 |
| 2006/0289972 A1 | 12/2006 | Nishimura et al. |
| 2007/0045840 A1 | 3/2007 | Varnau |
| 2009/0079070 A1 | 3/2009 | Lin et al. |
| 2009/0174069 A1 | 7/2009 | Nguyen et al. |
| 2009/0206480 A1 | 8/2009 | Lam |
| 2012/0067635 A1 | 3/2012 | Nang et al. |
| 2012/0252168 A1* | 10/2012 | Nah et al. ..................... 438/124 |

FOREIGN PATENT DOCUMENTS

| | | |
|---|---|---|
| KR | 100553562 B1 | 2/2006 |
| KR | 1020110091055 | 8/2011 |
| TW | 586159 | 5/2004 |
| TW | 201138040 | 11/2011 |

* cited by examiner

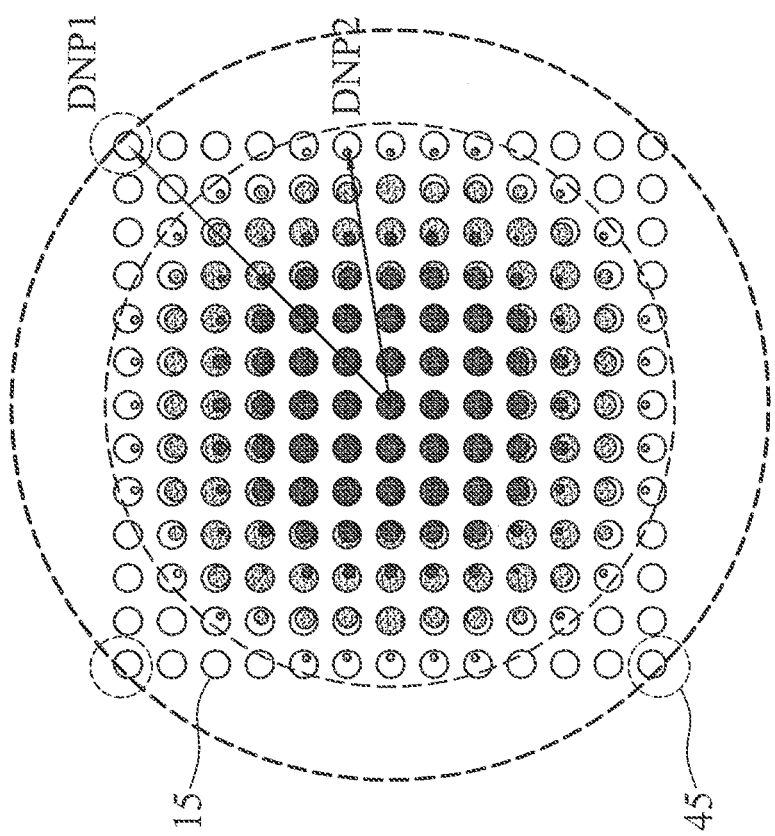

METHODS AND APPARATUS FOR SOLDER CONNECTIONS

BACKGROUND

Recent advances in packaging and integrated circuit processes result in increasing use of packages mounted on interposers or substrates to form modules that are mounted to printed circuit boards ("PCBs") to complete systems. As the use of increasingly advanced integrated circuits in ever smaller and denser devices, such as portable devices, increases, the need for smaller, thinner, and less costly techniques to couple integrated circuit devices to PCBs continues to increase.

The use of solder bumps and solder balls to connect devices is also becoming more prevalent. In a typical arrangement, a solder bumped integrated circuit die may be mounted on the top surface of an interposer formed of a laminate material, silicon, ceramic, films and the like. The lower surface of the interposer may then have solder balls arranged in a pattern that corresponds to a land or pad pattern on the PCB. This may be referred to as "flip chip" package, as the integrated circuit is mounted "face down," or flipped, onto the interposer. After the integrated circuit is mounted on the interposer, the assembly may then be mounted on the PCB. The use of stacked dies, or package on package arrangements, including the interposer, are known.

The use of the interposer, with the accompanying costs and manufacturing steps, increases costs and lowers throughput for the manufacture of the completed system. An alternative is to use wafer level processing ("WLP") to form solder connectors, typically solder balls, directly on the face of a semiconductor wafer. These steps may be performed on the entire wafer at once, achieving economies of scale and reducing costs. Further this approach can eliminate the need for an expensive interposer and the accompanying manufacture and test processes needed to produce it.

In the use of WLP packaging, the solder balls are attached to the PCB surface and to the post passivation interconnect ("PPI") connectors on the wafer or integrated circuit die. Because there will be thermal stress on the assembly during system operation due to the differences in coefficients of thermal expansion between the PCB material and the semiconductor wafer, the solder balls now have increased stress. Direct mounting of the die to the PCB using solder connectors results in added stress on the solder connectors, compared to "flip chip" packages with interposers.

In testing, solder connectors are shown to fail as "open" failures due to stress in thermal cycle tests. The solder balls can crack, particularly close to the PPI connections. Improved solder connectors are therefore needed.

BRIEF DESCRIPTION OF THE DRAWINGS

For a more complete understanding of the illustrative embodiments, and the advantages thereof, reference is now made to the following descriptions taken in conjunction with the accompanying drawings, in which:

FIG. 12 depicts in a plan view a structure for use with the embodiments;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the embodiments, and these examples do not limit the scope of this description and do not limit the scope of the appended claims.

The embodiments herein are illustrative examples but do not limit the scope of the disclosure and do not limit the scope of the appended claims. Embodiments of this disclosure include methods for forming a solder connection to an electrical terminal such as a pad or land. The solder connection includes at least one stud bump extending in a normal direction from the electrical terminal, and a solder connector such as a solder ball formed around and enclosing the stud bumps. Because the stud bumps add strength and adhere to the materials on the surface of the electrical terminal better than a solid solder connector, the resulting solder connection has fewer failures due to thermal stress, for example. The stud bump and solder ball may be formed at a wafer level process and then, the devices may subsequently be singulated and then mounted to a system board or PCB. The solder connections may be formed on a wafer, a die, or a substrate that has electrical terminals such as lands or pads. The solder connections may be formed directly on a bond pad for a wafer, or, on a pad that is part of a redistribution layer ("RDL") in a post passivation interconnection scheme.

Figure 1:
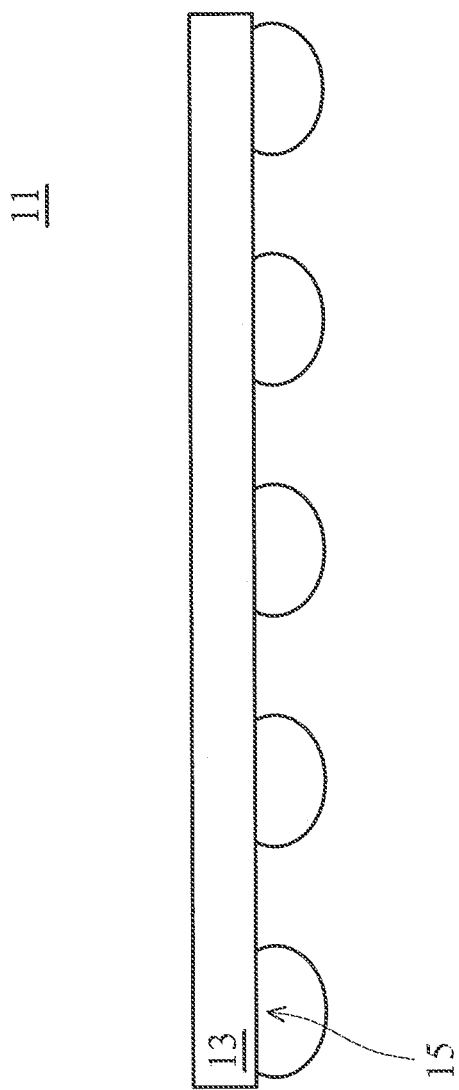
FIG. 1 depicts a cross-sectional view of a structure for use in illustrating the embodiments.

FIG. 1 depicts in a cross-sectional view an illustrative example structure 11 to demonstrate the use of the embodiments. Substrate 13, which may be a semiconductor wafer or other substrate, is shown with solder connectors 15 disposed on an active surface. The solder connectors 15 may be solder bumps or solder balls. The use of the word "solder" in this application includes without limitation both lead-based and lead-free solders, such as Pb—Sn compositions for lead-based solder, and lead-free solders including tin, copper, and silver, or "SAC" compositions, and other eutectics that have a common melting point and form conductive solder connections in electrical applications. For lead-free solder, SAC solders of varying compositions may be used, such as SAC 105 (Sn 98.5%, Ag 1.0%, Cu 0.5%), SAC 305, SAC 405 and the like. Lead-free solder connectors such as solder balls may be formed from SnCu compounds as well, without the use of silver (Ag). Alternatively, lead-free solder connectors may include tin and silver, Sn—Ag, with any copper.

The substrate 13 may be a semiconductor substrate such as silicon, germanium, gallium arsenide, and other semiconductor materials. The substrate may be an interposer, such as a silicon, laminate, ceramic, film, FR4, or other circuit board material and the embodiments may be applied to those substrates as well. The substrate, in some embodiments, is a silicon wafer comprising many integrated circuits fabricated prior to the use of the embodiments here to form the connections to the system board.

The cross-sectional view of FIG. 1 depicts a single row of solder connectors, typically the solder connectors are solder balls although other shapes such as pillars, cubes, squares, and columns may be used. When an array of the solder balls is formed on a grid, the resulting package for an integrated circuit may be referred to as a "ball grid array" or "BGA"; and the balls may be referred to as "BGA balls"; however, the embodiments described herein are not limited to BGA packages or BGA balls. The embodiments are not limited to the spherical or ball shapes for the solder connectors. In a practical application, hundreds or even thousands of these solder connectors 15 may be provided for an integrated circuit. A semiconductor wafer further may have many of these integrated circuits formed on it.

In use in a system, for example, the substrate 13 will be mounted to another board or assembly such as a system PCB board (not shown) using thermal reflow. The solder connectors 15 will be placed in alignment with conductive pads or lands on the system PCB, and, the solder connectors 15 will then be placed in physical contact with the pads or lands. Pick and place and auto alignment tools such as robot arms that are automated or manually operated may be used. A thermal reflow process then causes the solder connectors 15 to melt and cool to form both physical and electrical solder connections to the PCB board or assembly. Thus the solder connectors 15 become both physical and electrical connections to the system board. After the assembly, during testing and in use, the substrate 13 and the solder connectors 15 are exposed to thermal stresses. During mechanical stresses caused by subsequent thermal cycles, the solder connectors 15 must bear the stress of mechanical movement or mechanical force, such as those caused by coefficient of thermal expansion mismatch during thermal cycles. If the solder connectors 15 cannot bear the stress, solder cracking might occur. If the cracks open up, then an electrical open can occur, causing device failure in test or in the field.

Figure 2:
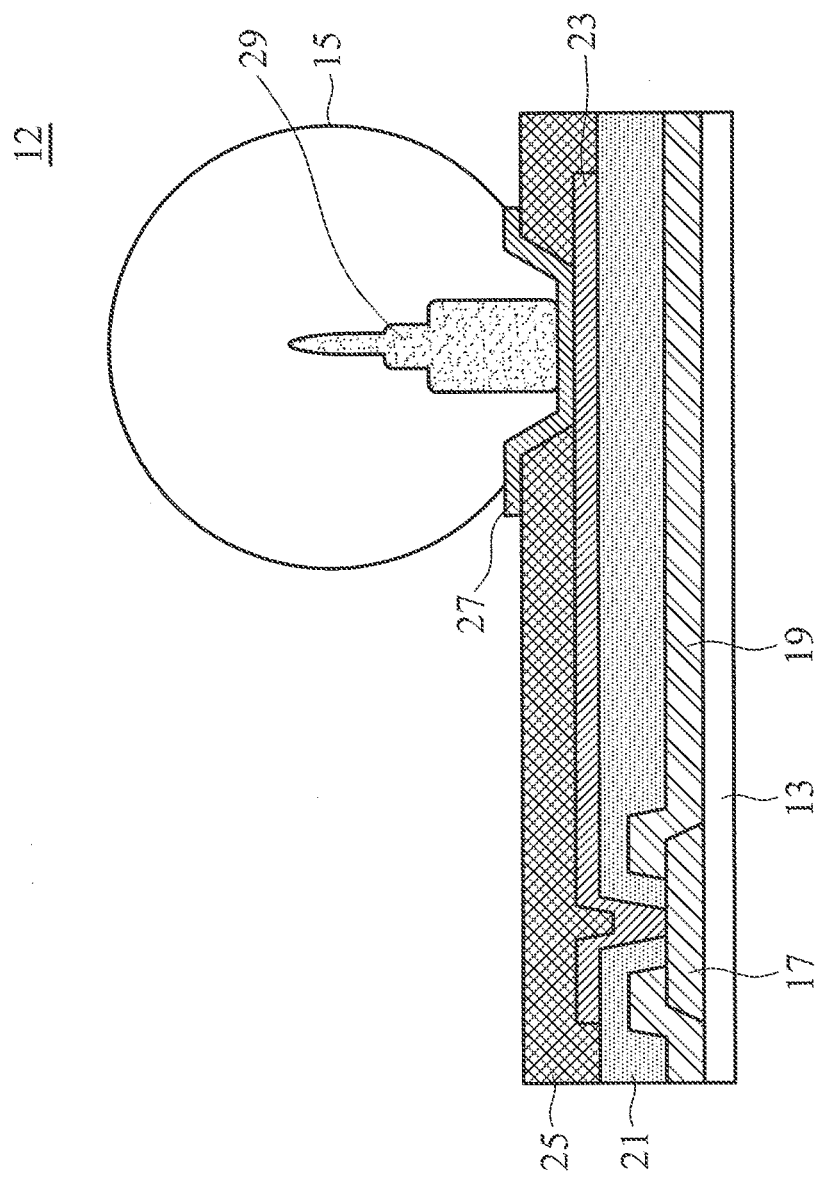
FIG. 2 depicts in a cross-sectional view an embodiment structure.

FIG. 2 depicts in cross-section a solder connection embodiment 12. In FIG. 2, a substrate 13 has a conductive terminal 17 that provides electrical connection to circuitry (not shown) in the substrate. Conductive terminal 17 may be, for example, a bond pad for an integrated circuit. Alternatively, terminal 17 could be a trace in a multi-layer substrate. Layer 19 is a passivation layer that is formed to protect the circuitry in substrate 13, for example. This may be a polyimide layer, a silicon nitride, a polymer or other protective dielectric material. In this embodiment 12, a redistribution layer ("RDL") is formed and connects terminal 17 to the solder connector 15. A first polymer layer 21 is shown forming an insulating layer for the RDL. A PPI trace 23, which is a conductor such as copper, aluminum, gold, or the like, is formed over the polymer layer 21 and extends, through an opening, to make electrical and physical connection to terminal 17 at one end. A second polymer layer 25, another dielectric or insulator, is shown disposed over the trace 23. Solder connector 15 is formed in an opening in the second polymer layer 25 exposing a portion of trace 23, which forms a pad or ball land. An under bump metallization ("UBM") layer 27 is formed over the second polymer layer 25 and extends into the opening, covering the upper surface of trace 23. UBM material is used to increase adherence of solder, and to provide some stress relief in the connection between the solder and the ball land portion of trace 23. Metals used for the UBM layer 27 include, but are not limited to, one or more of copper, aluminum, nickel, titanium, and chromium. Key characteristics of UBM are adhesion to the material of the conductor; here trace 23, providing a solder diffusion barrier, providing solderability and wettability for the mounting of the solder connectors, compatibility with the processes for forming the solder connections, and providing low resistance in the contact to the conductor 23.

A stud bump 29 is shown formed on the UBM layer 27, and extending in a normal direction away from the horizontal upper surface of the substrate 13. This stud bump 29 may be formed using capillary wire bonding equipment to form, for example, a thermo compression bond ("TCB"). A ball and stitch operation may be used to mechanically bond a wire ball to the UBM layer 27 and then the wire bonding operation forms the stud by cutting a vertical portion of the bond wire as the ball bond capillary tool moves in an upwards direction away from the UBM surface. This stud bump may be formed of copper, gold, or other wire bonding materials. As will be further described below, more than one stud bump 29 may be formed for a solder connector 15. Two, three, four or more stud bumps 29 may be used. The stud bump may be, for example, 50-80 microns in diameter. The stud bump height may be from 80-160 microns. The stud bump has a wide base and a narrow or pointed top as it forms in the ball and stitch operation. In cross section it may generally appear to be a pillar shape with a narrow top.

A solder connector 15, which may be a solder ball, is then formed on the UBM layer 27 and surrounds and encloses the stud bump 29. The solder ball may be formed by stenciling the solder material chosen on the second polymer layer 25 at the locations of the UBM layer 27, the ball lands, and then subjecting the solder material to a solder thermal reflow process. The surface tension of the molten solder will cause the spherical solder balls to form around the stud bumps 29 as shown in FIG. 2. The stud bumps of the embodiments add mechanical strength and prevent the ball cracks at the critical area where the solder connector 15 meets the UBM layer 27. Also, even if some solder cracks do form near the solder-UBM boundary, the stud bump provides an additional electrically conductive connection into the remainder of the solder ball, preventing an electrical "open" from forming, so that no electrical failure occurs.

Figure 3:
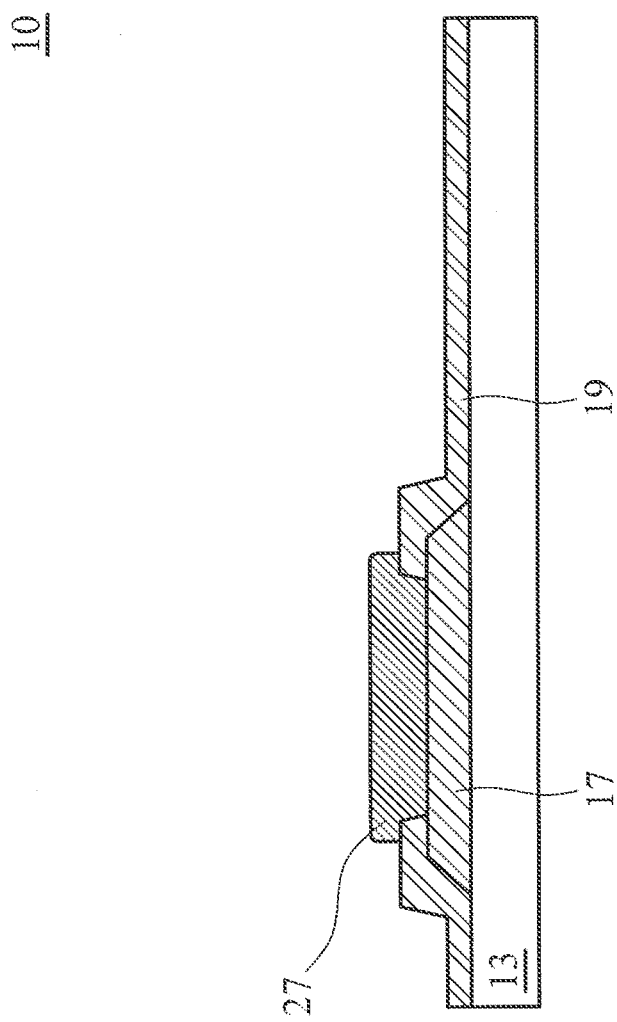
FIG. 3 depicts in a cross-sectional view an embodiment structure at an intermediate process step.

FIG. 3 depicts in cross-section an additional alternative embodiment 10 at an intermediate process step, for explanation of additional method embodiments. In FIG. 3, the substrate 13 is shown with a conductive terminal 17, which may be an integrated circuit bond pad. Alternatively, conductive terminal 17 may be another interconnect terminal. A passivation layer 19 is depicted overlying the substrate 13 and the terminal 17. This may be, for example, a polyimide layer; other passivation materials include dielectrics such as silicon nitride, for example. A UBM layer 27 is shown disposed over and in contact with the terminal 17, covering the upper surface, and partially overlying a portion of the passivation layer 19. Note that in this embodiment, the UBM layer 27 is directly over the terminal 17, that is, no redistribution layer RDL is used in this example.

Figure 4:
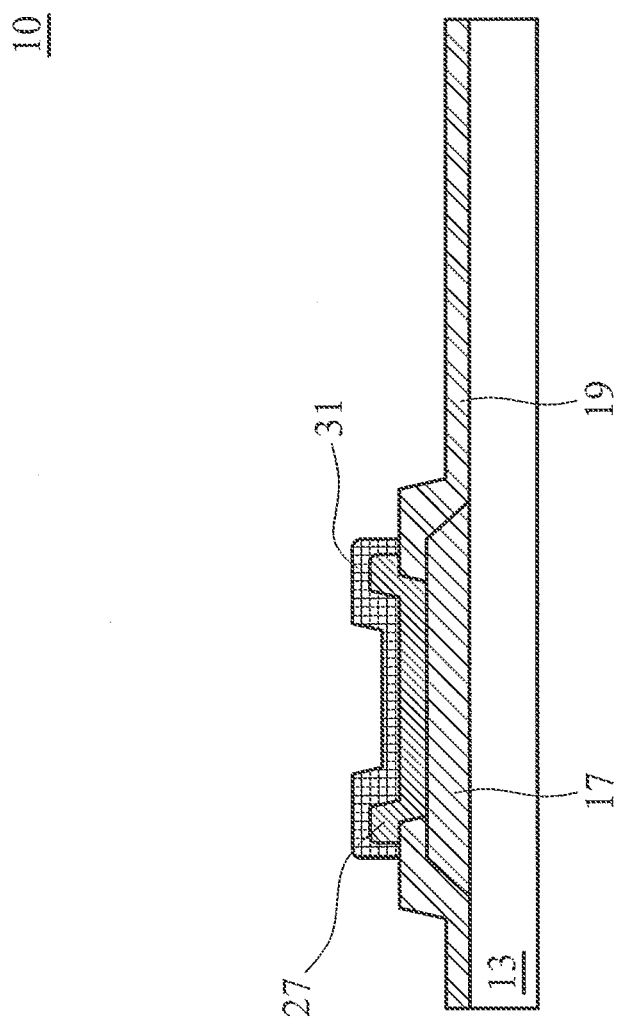
FIG. 4 depicts in a cross-sectional view the structure of FIG. 3 following additional processing.

FIG. 4 depicts in cross-section the embodiment 10 following additional process steps. In FIG. 4, substrate 13 and terminal 17, and the passivation layer 19, and UBM layer 27, are arranged as before and are not further described here. A surface finish is provided as layer 31. This surface finish may be electroless plating, such as nickel (Ni), gold (Au), nickel and gold, palladium, platinum, or other surface finishes used for solder connections. Combination plating finishes such as "ENIG"—electroless nickel-immersion gold, or "ENEPIG"-electroless nickel, electroless palladium-immersion gold, may be used. These finish layers aid in solderability and in bonding of copper stud bumps, for example.

Figure 5:
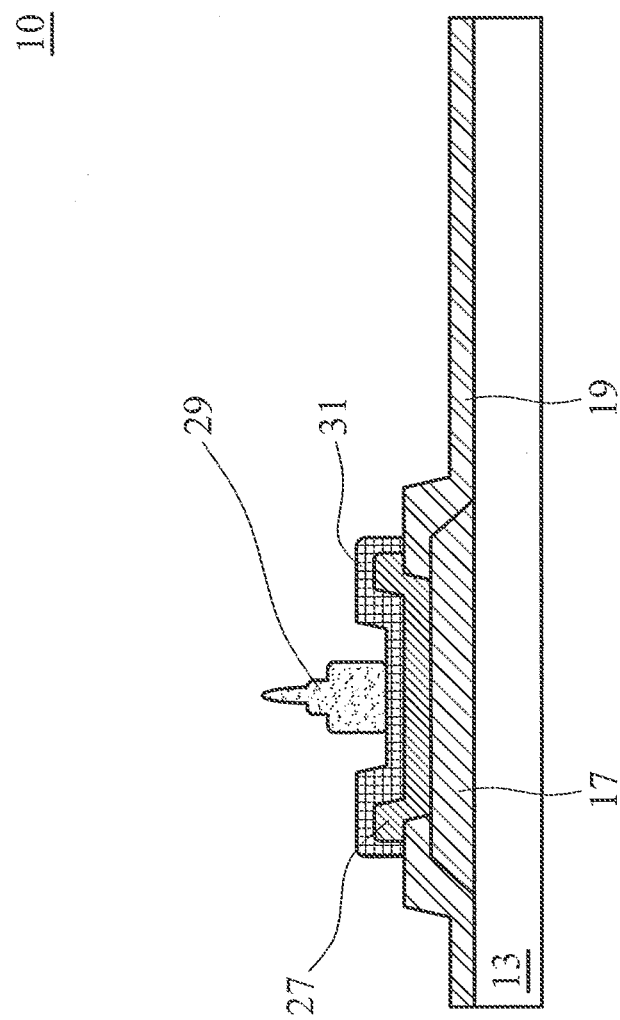
FIG. 5 depicts in a cross-sectional view the structure of FIG. 4 following additional processing.

FIG. 5 depicts in cross-section the structure 10 of FIG. 4 following additional processing steps. To transition from FIG. 4 to FIG. 5, the substrate 13, terminal 17, passivation layer 19, UBM layer 27 and finish layer 31 are all shown arranged as before. Stud bump 29 is then formed over the finish layer 31. This stud bump 29 may be formed, for example, by using a capillary ball bonding tool to perform a ball bond and cutting the bond wire as the tool moves vertically away, to form the stud portion. The stud bump has a mechanical bond to the surface of the finish layer 31 and extends in a direction that is normal to the horizontal upper surface of substrate 13. The stud bump may be of copper, gold, or other materials used as bond wires used in ball bonding equipment. Thermocompression bonding may be used. Ultrasonic energy may be used to form the stud bump and better bond it to the finish layer 31. Multiple stud bumps 29 may be formed in each connector; or only one, as shown in the embodiment of FIG. 5.

Figure 6:
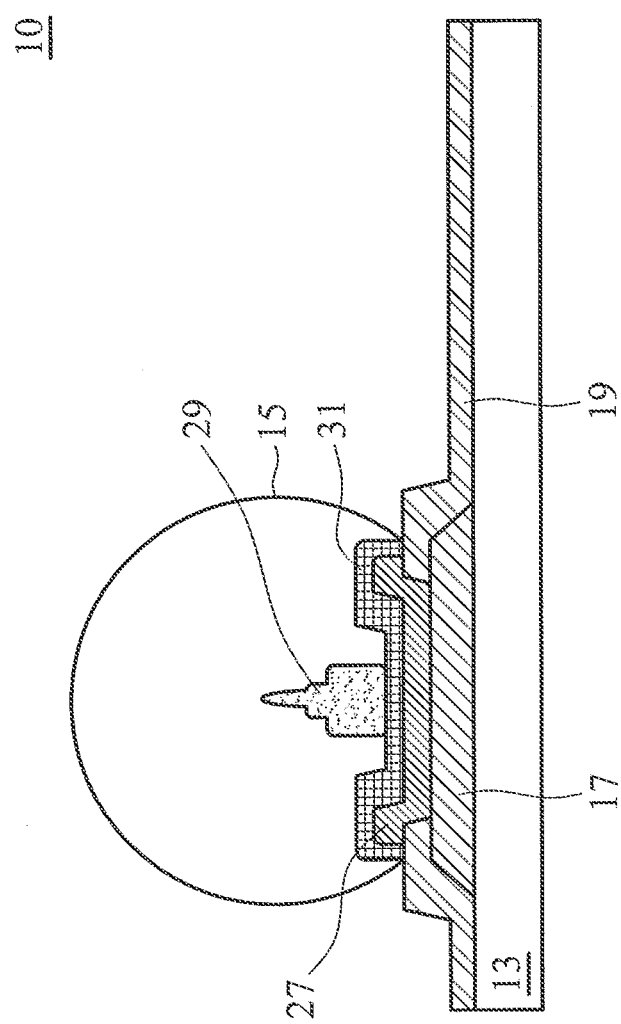
FIG. 6 depicts in a cross-sectional view the structure of FIG. 5 following additional processing.

FIG. 6 depicts in cross-section the structure 10 of FIG. 5 following additional process steps. The substrate 13, terminal 17, passivation layer 19, UBM layer 27, finish layer 31, and stud bump 29 are all arranged as shown in FIG. 5. A solder connector 15 is formed, in this exemplary embodiment; this is a solder ball, although other shapes could be used. To form the solder connector 15, solder is disposed on the substrate, for example by a screening of a solder paste through a stencil. The solder is reflowed using a thermal reflow, and due to the surface tension properties of the solder in its molten state, as it cools a spherical ball is formed around and enclosing the stud bump 29 and over the finish layer 31, as shown. In an embodiment, the finish layer and the UBM may be around 200-240 microns in diameter, and the solder ball formed on the finish layer 31 would therefore be somewhat larger in diameter, for example 220-280 microns. A pitch between the solder balls may be from 300-400 microns, for example. The stud bump may be, for example, 50-80 microns in diameter. The stud bump height may be from 80-160 microns.

Because the stud bump 29 bonds well to the finish layer 31, and the stud bump extends in a normal direction away from the substrate 13 towards the center of the solder connector 15, additional strength is provided by the use of the stud bumps. In particular, the stud bump provides added strength in the area close to the material boundary between the solder connector 15 and the finish layer 31. This is an area where ball cracking has been observed in thermal cycling tests of prior solder balls. Even if a ball crack does develop, the stud bump 29, being of copper or gold, or another conductor material, adds an additional electrical path from around the center of the solder ball 15 to the conductive terminal 17 and so prevents an "open" electrical connection from being caused by the ball cracking.

Figure 7:
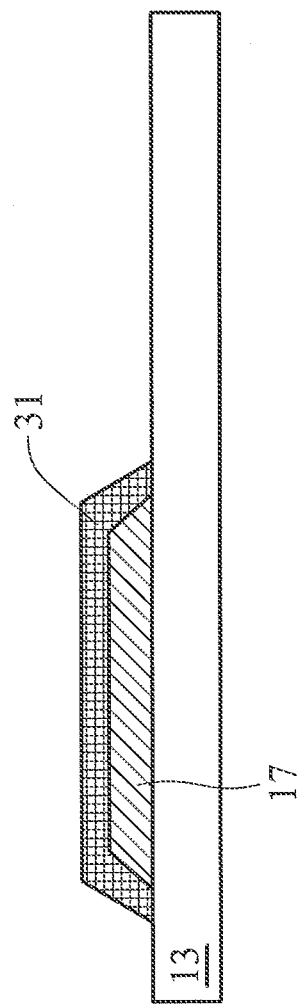
FIG. 7 depicts in a cross-sectional view a structure illustrating an alternative embodiment at an intermediate process step.

The embodiments presented above show the use of UBM layers with the use of the stud bumps. FIG. 7 depicts in a cross-sectional view an embodiment 14, which is similar to the above described embodiments, however the UBM is not used in this embodiment.

In FIG. 7, the embodiment 14 is depicted at an intermediate process step. Substrate 13 has a conductive terminal 17, which may be an integrated circuit bond pad, or a post passivation interconnect terminal, that is connected electrically to other circuitry in the substrate, for example. A surface finish layer 31 is formed on the terminal. In one embodiment an electroless film may be used. This surface finish layer 31 may be nickel, gold, palladium, ENIG, or ENEPIG, as examples.

Figure 8:
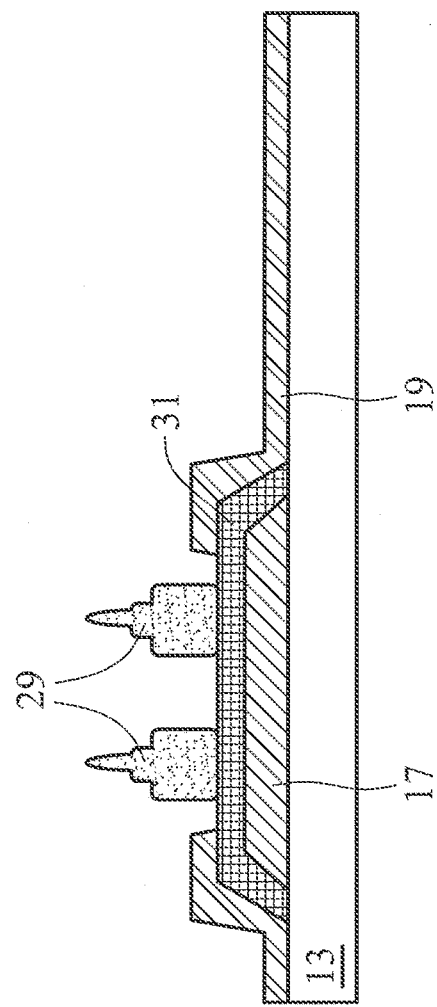
FIG. 8 depicts in a cross-sectional view the structure of FIG. 7 following additional processing.

FIG. 8 depicts the embodiment 14 from FIG. 7 following some additional processing. In FIG. 8, a passivation layer 19, which may be a polyimide, polymer, nitride or other dielectric, is formed and overlies the substrate 13 and a portion of the finish layer 31. An opening in the layer 19 is provided as a ball land for receiving a solder connection. A pair of stud bumps 29 is depicted formed on the finish layer 31 in the opening, and, extending in a normal direction upwards (in this arbitrary orientation, of course the substrate 13 may be turned over and then the stud bumps 29 would then extend downwards in the figures, this orientation is used for illustration only, and is not limiting). In this embodiment, the UBM material shown in the embodiments described above is not used. Further, in an example embodiment where the stud bumps are gold and the conductive terminal 17 is copper, the finish layer 31 may be omitted altogether, and good results are still obtained, because the gold stud bumps form an excellent mechanical bond to a copper terminal.

Figure 9:
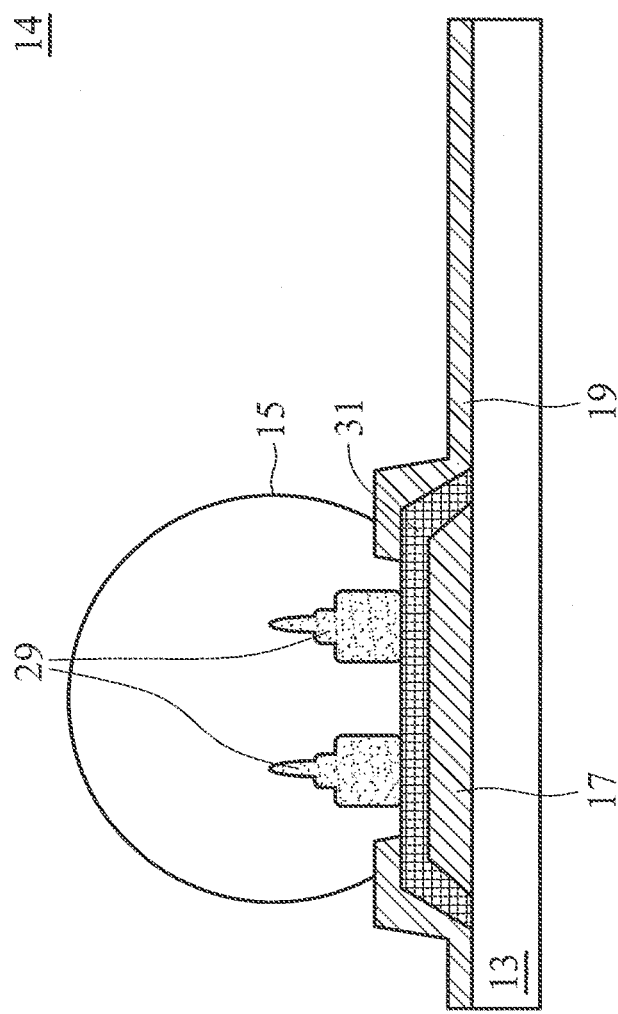
FIG. 9 depicts in a cross-sectional view the structure of FIG. 8 following additional processing.

FIG. 9 depicts in cross-section the completed structure 14 following additional processing from FIG. 8. A solder connector 15, typically a solder ball but not limited to solder balls, is formed over the finish layer 31 in the opening in the passivation layer 19. The solder connector surrounds and encloses the pair of stud bumps 29. As before, the stud bumps provide additional strength and an additional electrical path, preventing "open" faults due to solder cracking that might be caused by thermal cycling and mechanical stress associated with thermal mismatch of the materials.

Figure 10:
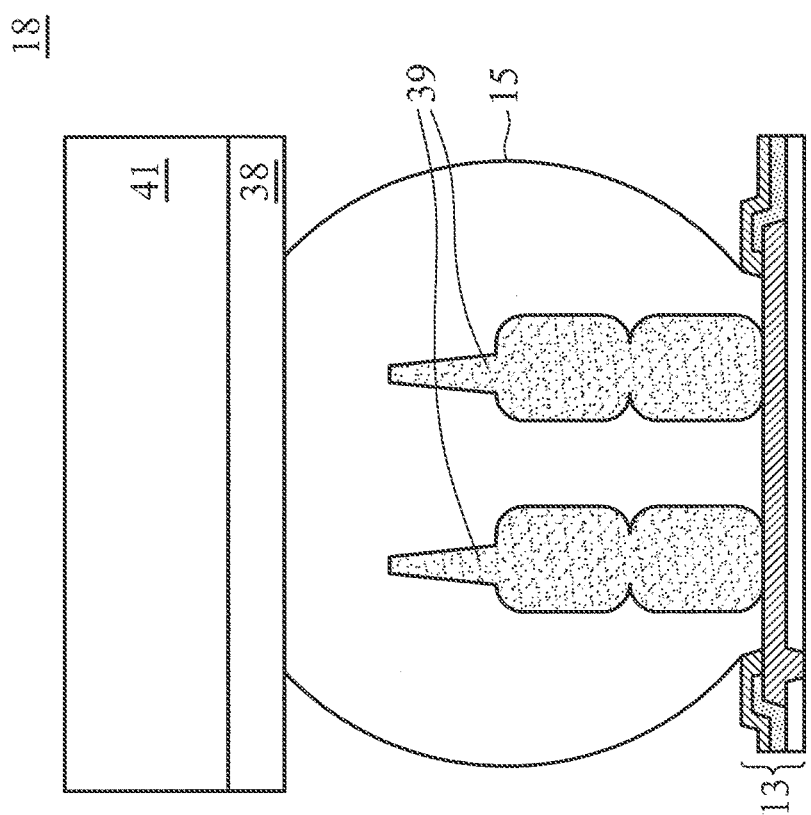
FIG. 10 depicts in a cross-sectional view yet another alternative structure.

FIG. 10 depicts in a cross-section an embodiment 18, which is an alternative embodiment. In the embodiment 18, each of the stud bumps is further stacked to form a stud bump stack 39. The use of stacked stud bumps increases the height of the stud bumps, and also increases the solder ball size as well by increasing the material in the solder ball. Further, the use of the stacked stud bumps extends the stud bumps farther into the solder connector 15, adding additional electrical paths between a pad 38 on the top package 41 and the substrate 13, so that if a crack occurs near the substrate 13, the electrical connection will not be disrupted. The stacked stud bumps 39 may also be formed using a wire bond bonding tool with a capillary, and stacking one stud bump on a first one. The stacked stud bumps 39 of this embodiment 18 may also be used in the embodiment of FIG. 2, and in the embodiments of FIGS. 6 (including UBM) and 9 (without UBM) and each of these alternatives creates additional embodiments that are contemplated as embodiments within the scope of the appended claims.

Figure 11:
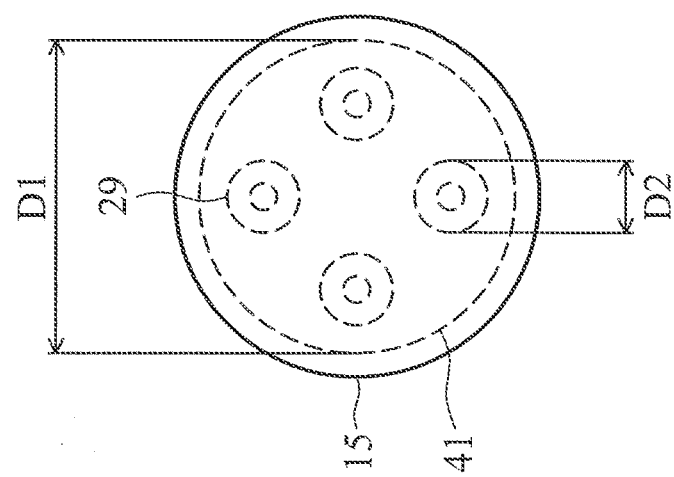
FIG. 11 depicts in a top view an embodiment structure.

FIG. 11 depicts a top view of a solder connector of the embodiments. In FIG. 11, connector 15 is shown with a diameter of greater than, for example, 240 microns. The number of stud bumps illustrated is four, in additional example embodiment, 1, 2 and 3 stud bumps were used. In some embodiments, the use of 3 or more stud bumps achieved excellent results but the embodiments are not limited to any particular number of stud bumps. In an example, the diameter D1 of the UBM or finish layer beneath the solder connectors was around 240 microns, with the stud bumps having a diameter of between 50-80 microns, and having a height extending into the solder connector from the substrate of about 80-160 microns. None of these size ranges are limiting, however, embodiments may include stud bumps with larger or smaller diameters, or larger or small heights. The solder connectors may be made larger or smaller as well.

FIG. 12 depicts in a plan view a substrate 43 incorporating embodiments of the solder connectors. An array of solder connectors that is, in this non-limiting example, 13×13 is shown, for a total of 169 solder connectors 15. In thermal cycle tests of substrates with solder ball connectors, the stresses experienced in the solder balls was observed. The stress experienced by the solder balls is not uniform, the lowest stresses were observed in balls near the central "neutral point", or the center of the array of solder connectors. By plotting the distance to the neutral point ("DNP") for each of the balls and observing the stress in thermal cycles, it was determined that the greatest stress is at the four corners, such as at area 45 in the figure, those are the solder balls that have the maximum DNP, here shown as a radius from the central ball and labeled DNP1. Balls that are closer to the neutral point, but that still experience considerable stress, are those near the outside rows of the array, which can be said to be at a DNP that is greater than or equal to another distance, shown as DNP2, but less than DNP1. The balls closer to the center and inside the radius DNP2 experience lower stress due to thermal effects.

Figure 13C:
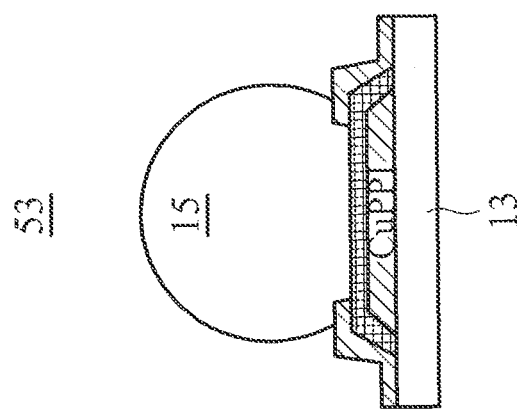
FIG. 13C depicts in a cross-sectional view another embodiment for use in the structure of FIG. 12.
Figure 13B:
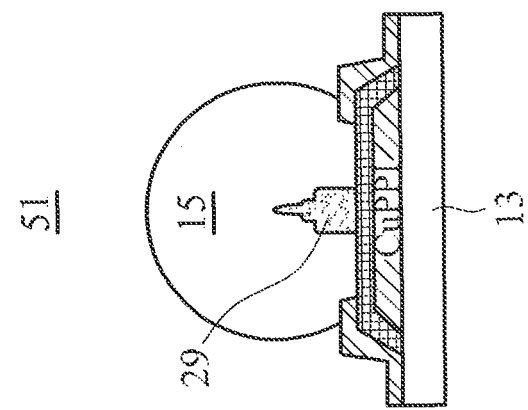
FIG. 13B depicts in a cross-sectional view another embodiment for use in the structure of FIG. 12.
Figure 13A:
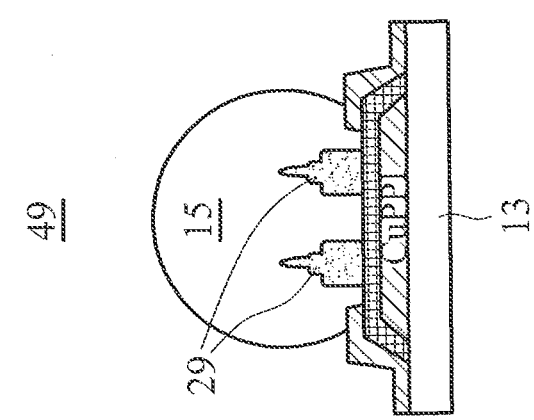
FIG. 13A depicts in a cross-sectional view an embodiment for use in the structure of FIG. 12.

FIGS. 13A, 13B and 13C depicts in a cross-sectional view three solder connectors 49, 51 and 53 for use with the arrangement of FIG. 12. In FIG. 13A, the solder connector 49 has two stud bumps visible in cross-section; in additional alternative embodiments the solder connector 49 may include 3, 4 or more stud bumps. In an embodiment method, the solder connectors identified for an array or integrated circuit pattern that are farthest from the neutral point, a distance DNP1, may be implemented using this approach. In FIG. 13B, solder connector 51, also depicted in cross-section, has a single stud bump. In the method embodiment, the connectors that are less than a distance DNP1, but more than or equal to a smaller distance DNP2 from the neutral point, may be implemented using the single stud bump as in connector 51. In FIG. 13C, a solder connector 53 illustrates the use of a conventional solder connector with no stud bumps. For solder connectors closest to the neutral point, that is having a distance to the neutral point less than DNP2, these solder connectors may be provided with no stud bumps, as the mechanical stress observed for these locations is less than for those at the maximum distance DNP1, or the second lesser distance DNP2, from the neutral point. By using the stud bump of the embodiments only in some, but not all, of the solder connectors for the array or device, the advantages of the embodiments are still attained, while lowering the system cost and increasing throughput.

Figure 14:
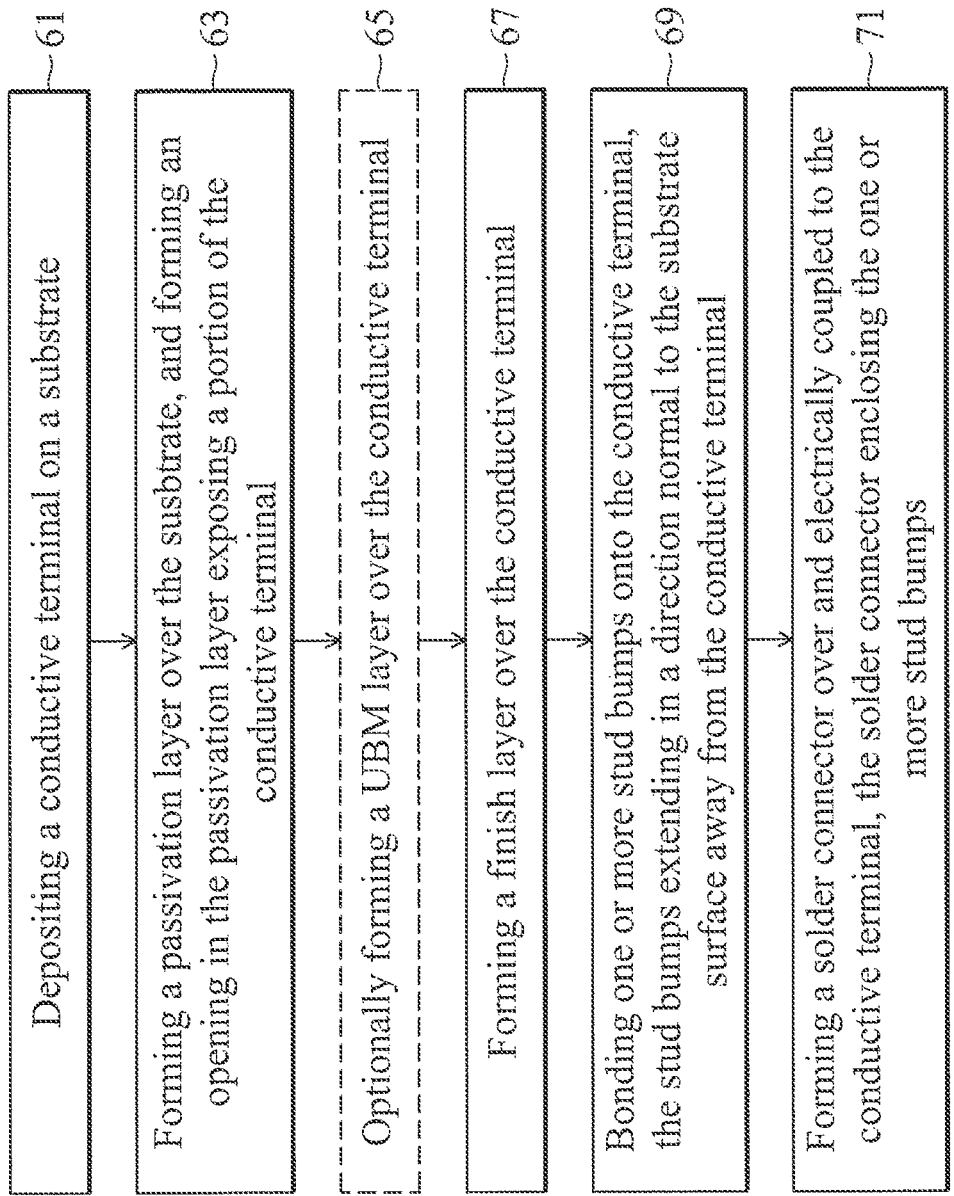
FIG. 14 depicts in a flow diagram a method embodiment.

FIG. 14 depicts a method embodiment in a flow diagram. In step 61, a substrate is provided with a conductive terminal. In step 63 a passivation layer is formed over the substrate, and an opening is provided in the passivation layer exposing a portion of the conductive terminal. In step 65, an optional step of forming a UBM layer is performed. In step 67, a finish layer is provided over the conductive terminal. In step 69, one or more stud bumps are formed on the conductive terminal, and the stud bumps extend in a normal direction away from the surface of the substrate. In step 71, a solder connector is formed over the conductive terminal. This embodiment corresponds to methods for forming the embodiment of FIG. 6, for example.

Figure 15:
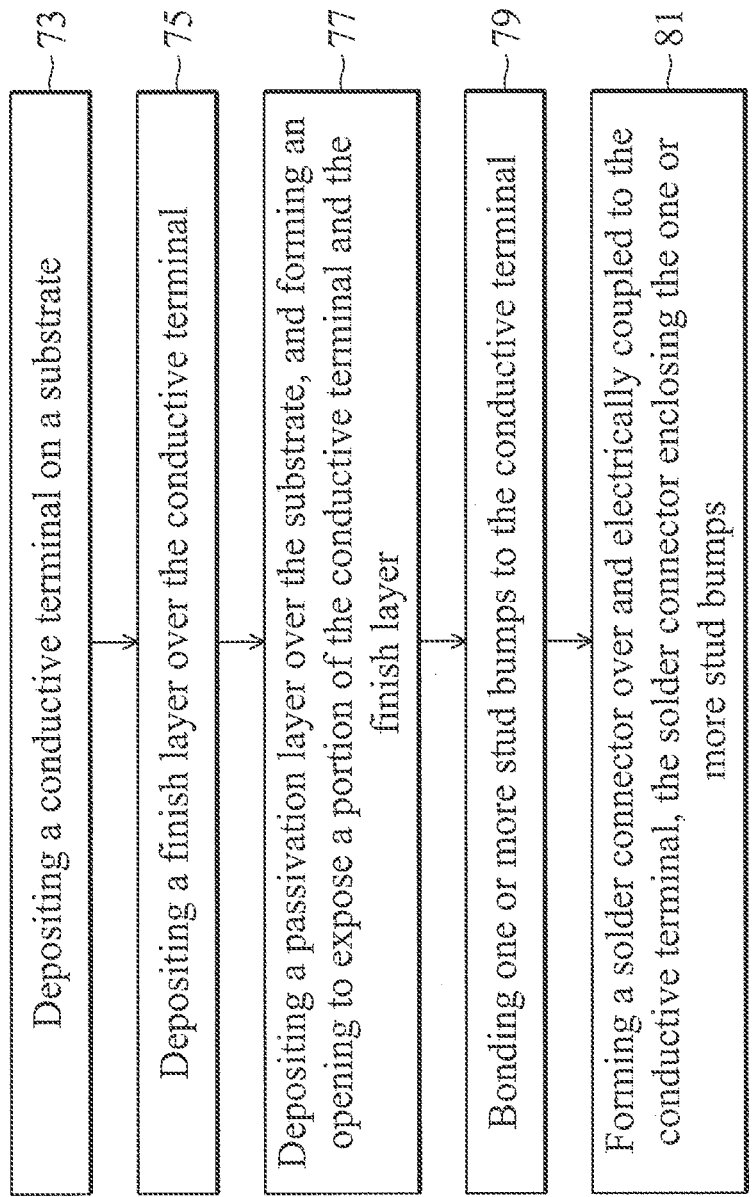
FIG. 15 depicts in a flow diagram an alternative method embodiment.

FIG. 15 depicts an alternative method embodiment. In FIG. 15, the method begins by depositing a conductive terminal over a substrate at step 73. At step 75, a finish layer is deposited over the conductive terminal. In step 77, a passivation layer is formed over the substrate and an opening is formed to expose the conductive terminal and the finish layer. In step 79, one or more stud bumps is formed on the finish layer and electrically coupled to the conductive terminal. In step 81, the solder connector is formed over and enclosing the stud bumps. This method embodiment corresponds to a method for forming the embodiment of FIG. 9, for example.

Figure 16:
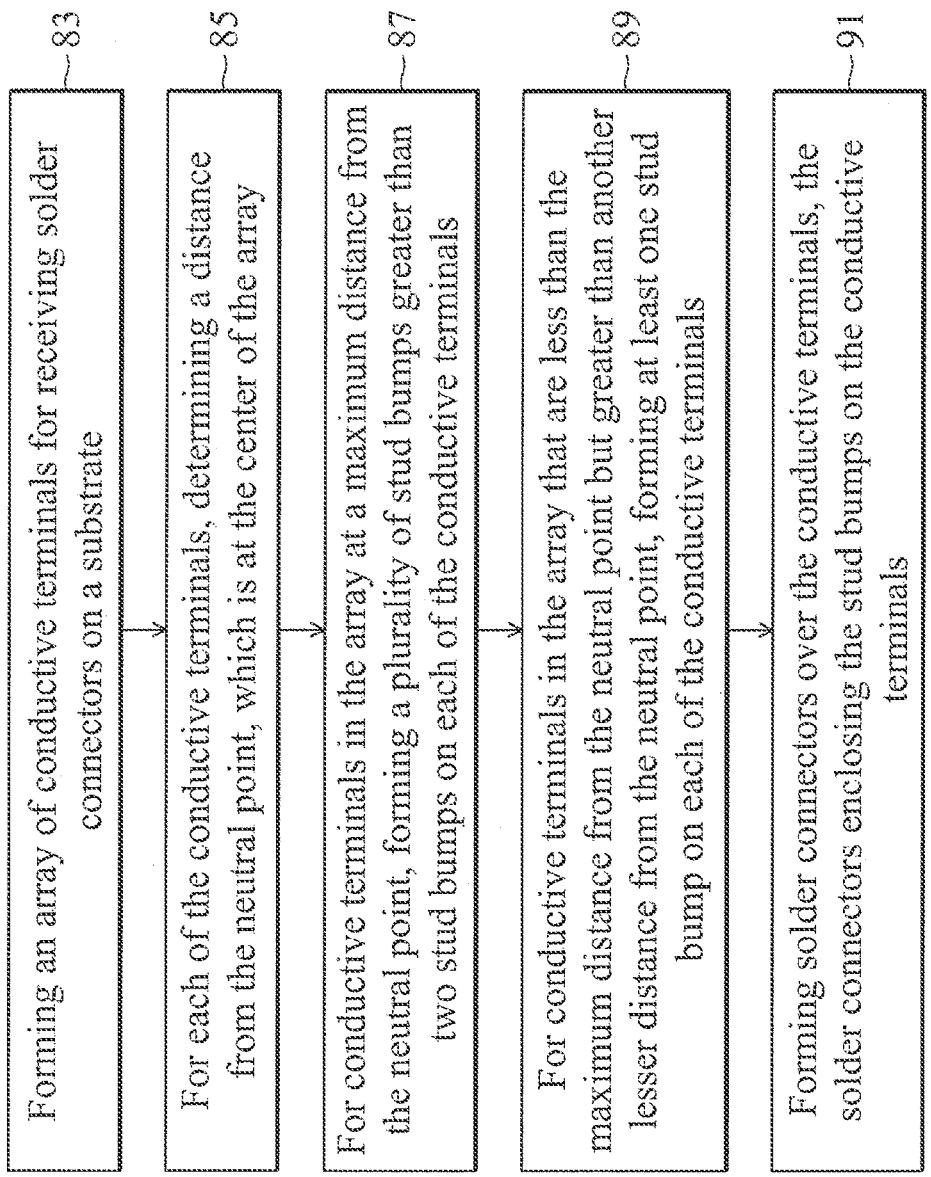
FIG. 16 depicts in another flow diagram another method embodiment.

FIG. 16 depicts in a flow diagram another method embodiment. In step 83, an array of conductive terminals is formed on a substrate. In step 85, a distance from the neutral point, which is at the center of the array, is determined for each of the conductive terminals. In step 87, for the conductive terminals having a maximum distance from the neutral point, a plurality of stud bumps greater than two stud bumps is formed for each of the conductive terminals.

In step 89, conductive terminals are identified that are less than the maximum distance from the neutral point but greater than another lesser distance from the neutral point. For each of these conductive terminals, at least one stud bump is formed on each of them. No stud bumps are formed in the remaining conductive terminals in the array.

In step 91, then, the solder connectors are formed over the conductive terminals. Note that some of the conductive terminals have no stud bumps, those at a distance greater than or equal to the lesser distance from the neutral point have at least one stud bump, those at the greatest distance or equal to the greatest distance from the neutral point have more than two stud bumps. Alternatives include using two stud bumps for those at the greatest distance, at least one stud bump for the connectors at the middle distance, and no stud bumps for the ones that are closer to the neutral point.

The numbers of stud bumps described above are examples. Alternative embodiments can use more stud bumps per bump, or fewer. The relationship of interest is the distance to the neutral point DNP and the number of stud bumps. As the DNP gets larger, the balls that are at that distance, or greater, will see greater mechanical stresses. The number of stud bumps to be used may then be increased for solder balls at a particular DNP, or greater.

In some applications, the maximum DNP may be relatively low, due to the solder ball arrangement. In such a case, an alternative embodiment may be used where the stud bumps are only used in the solder balls that see the greatest stress, that is, the outermost corner balls may have a single stud bump. In other cases, where the array of solder balls is quite large, there may be some solder balls at a very great DNP, some with an intermediate DNP, and some close to the neutral point with a correspondingly low DNP. In such an example, as another alternative embodiment, the solder balls with a distance to the neutral point greater than or equal to a first predetermined threshold may have as many as four or more stud bumps per ball, the solder bumps having a distance to the neutral point greater than a second predetermined threshold but less than the first predetermined threshold may have, for example, one or two stud bumps per ball, and the solder balls with a distance to the neutral point less than both the first and second thresholds may have no stud bumps in each solder ball. Thermal cycle testing and drop tests on prototypes may be used to determine how many solder balls in a particular device require the stud bumps, and what the predetermined DNP thresholds should be to ensure a reliable device. The die size, solder ball size, and ball density and ball pitch are all factors in this determination that vary with the applications, and many alternatives are possible.

Use of the embodiments provides an improved wafer level process compatible solder connection for use in mounting integrated circuits in "flip-chip" arrangements (with the active surface facing the PCB board) on system boards, without the use of intermediate interposers. Use of the embodiments advantageously provides thinner assemblies and fewer parts, lowering costs and reducing possible failure mechanisms, due to simpler arrangements. The use of the stud bumps disposed inside the solder ball connectors of the embodiments reduces ball crack failures and reduces or eliminates electrical opens seen in solder connections, such as solder balls, that are formed using the prior approaches. Solder connectors including the embodiments may be reliably used without a flip chip interposer to directly mount integrated circuits to PCB boards. Wafer scale integration is also contemplated. In this approach, multiple integrated circuits are completed together at the wafer stage and several may be mounted as one assembly together to a system board, in a single solder reflow operation. Devices may be stacked vertically on top of the wafer in a "package on package" or stacked die arrangement, and then the embodiment solder connections with the stud bumps may be used to mount the stacked devices to a system board.

In an embodiment, an apparatus includes a substrate having a conductive terminal on a surface; a passivation layer overlying the surface of the substrate and the conductive terminal; an opening in the passivation layer exposing a portion of the conductive terminal; at least one stud bump bonded to the conductive terminal in the opening and extending in a direction normal to the surface of the substrate; and a solder connection formed on the conductive terminal in the opening and enclosing the at least one stud bump. In a further embodiment, the above apparatus includes the at least one stud bump selected from copper and gold. In yet another embodiment, in the above apparatus the conductive terminal further includes an under bump metallization UBM layer overlying the opening in the passivation layer and beneath the at least one stud bump.

In still a further embodiment, the apparatus is provided as described above and the conductive terminal further includes a finish layer overlying the UBM layer and beneath the at least one stud bump. In still another alternative embodiment, the apparatus described above is provided and the conductive terminal further includes a finish layer overlying the conductive terminal and beneath the at least one stud bump. In yet another embodiment the finish layer is selected from gold, nickel, palladium, electroless nickel-immersion gold "ENIG", and electroless nickel-electroless palladium-immersion gold "ENEPIG".

In additional embodiments, in the apparatus above the at least one stud bump further includes at least two stud bumps. In still further embodiments, in the apparatus above the at least one stud bump further includes three or more stud bumps. In still further embodiments, in the apparatus above, the solder connection includes a solder ball. In yet another embodiment, in the apparatus above the substrate includes a semiconductor wafer.

In another embodiment, an apparatus includes a semiconductor wafer having a plurality of integrated circuits formed therein; a plurality of conductive terminals formed on a surface of the semiconductor wafer and coupled to circuitry within the semiconductor wafer; at least one passivation layer formed over the surface of the semiconductor wafer; openings provided in the passivation layer, exposing a portion of an upper surface of the plurality of conductive terminals; at least one stud bump formed on at least some of the conductive terminals in the openings, the at least one stud bump bonded to the conductive terminals and extending in a direction normal to the surface of the semiconductor wafer; and a solder connection formed over each of the conductive terminals and surrounding the at least one stud bump on the at least some of the conductive terminals.

In still a further embodiment, the apparatus includes an under bump metallization (UBM) layer formed over the passivation layer and extending into the openings and covering the conductive terminals, and lying beneath the at least one stud bump on the at least some of the conductive terminals. In another embodiment, the apparatus includes a finish layer formed over the conductive terminals and lying beneath the at least one stud bump on the at least some of the conductive terminals. In still a further alternative embodiment, the at least one stud bump are selected from copper and gold. In another embodiment, for at least a subset of the at least some of the conductive terminals, the at least one stud bump further includes two or more stud bumps formed on the conductive terminals in the openings.

In yet another embodiment, a method includes providing a substrate having a surface with a plurality of conductive terminals formed thereon; forming a passivation layer over the surface; forming openings in the passivation layer exposing the conductive terminals; for at least some of the plurality of conductive terminals, forming at least one stud bump bonded to the conductive terminals and extending from the conductive terminal in a direction normal to the surface of the substrate; and forming solder connections over the conductive terminals, the solder connections surrounding the at least one stud bump on each of the at least some of the plurality of conductive terminals.

In a further embodiment, the method is performed wherein providing the substrate includes providing a semiconductor wafer having integrated circuits fabricated thereon. In another embodiment, the above method is performed wherein forming the at least one stud bump further includes forming a stack of stud bumps. In still another embodiment the method above further includes wherein after the forming at least one stud bump bonded to the conductive terminals of at least some of the plurality of conductive terminals, remaining ones of the plurality of conductive terminals are free from the stud bumps. In still another alternative embodiment, the above method is performed wherein forming the at least one stud bump includes forming a number of stud bumps of two or greater.

Although the illustrative embodiments and their advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus, comprising:
    a substrate having a first conductive feature and a second conductive feature on a surface, each of the first conductive feature and the second conductive feature including a conductive terminal;
    at least one first stud bump bonded to the first conductive feature and extending in a direction normal to the surface of the substrate;
    at least one second stud bump bonded to the second conductive feature and extending in a direction normal to the surface of the substrate, the first conductive feature and the second conductive feature having a different number of distinct and separated stud bumps; and
    a solder connection formed on each of the first conductive feature and the second conductive feature enclosing the at least one first stud bump and the at least one second stud bump.

2. The apparatus of claim 1, wherein the at least one first stud bump comprises one selected from the group consisting essentially of copper and gold.

3. The apparatus of claim 1, wherein the first conductive feature further comprises an under bump metallization layer overlying an opening in a passivation layer and beneath the at least one first stud bump.

4. The apparatus of claim 3, wherein the first conductive feature further comprises a finish layer overlying the under bump metallization layer and beneath the at least one first stud bump.

5. The apparatus of claim 1, wherein the first conductive feature comprises a finish layer overlying the conductive terminal and beneath the at least one first stud bump, wherein the at least one first stud bump is bonded directly to the finish layer.

6. The apparatus of claim 5, wherein the finish layer comprises one selected from the group consisting essentially of gold, nickel, palladium, electroless nickel-immersion gold and electroless nickel-electroless palladium-immersion gold.

7. The apparatus of claim 1, wherein the at least one first stud bump further comprises three or more stud bumps.

8. An apparatus, comprising:
    a semiconductor substrate having a plurality of integrated circuits formed therein;
    a plurality of conductive features formed on a surface of the semiconductor substrate and coupled to circuitry within the semiconductor substrate;
    at least one stud bump formed on at least some of the conductive features, the at least one stud bump bonded to the conductive features and extending in a direction normal to the surface of the semiconductor substrate, wherein a first subset of the at least some of the conductive features has a first number of distinct and separated stud bumps and a second subset of the at least some of the conductive features has a second number of distinct and separated stud bumps, the first number being greater than the second number, wherein the second subset of the at least some of the conductive features is closer to a center of the semiconductor substrate in a plan view than the first subset of the at least some of the conductive features; and
    a solder connection formed over each of the conductive features and surrounding the at least one stud bump on the at least some of the conductive features.

9. The apparatus of claim 8, wherein the conductive features comprise an under bump metallization layer formed over a passivation layer and extending into openings in the passivation layer to a conductive terminal.

10. The apparatus of claim 8, wherein each of the conductive features comprise a finish layer formed over a conductive terminal.

11. The apparatus of claim 8, wherein the at least one stud bump each comprise one selected from the group consisting essentially of copper and gold.

12. The apparatus of claim 1, further comprising a third conductive feature, the third conductive feature having no stud bumps bonded thereto.

13. The apparatus of claim 8, wherein at least one of the plurality of conductive features have no stud bumps bonded thereto.

14. An apparatus comprising:
    a substrate having electrical circuitry;
    a first conductive feature on the substrate, the first conductive feature being electrically coupled to the electrical circuitry;
    a second conductive feature on the substrate;
    a first number of first stud bumps on the first conductive feature, the first number being one or more;
    an electrical connection formed over the first conductive feature and around the first stud bumps;
    a second number of second stud bumps on the second conductive feature, the second number being greater than the first number; and
    a third conductive feature on the substrate, wherein the third conductive feature is free from stud bumps.

15. The apparatus of claim 14, wherein the second conductive feature is further from a center of the apparatus than the first conductive feature in a plan view.

16. The apparatus of claim 14, wherein the conductive feature comprises a conductive terminal and an under bump metallization, wherein a passivation layer is interposed between a portion of the conductive terminal and the under bump metallization.

17. The apparatus of claim 14, wherein the third conductive feature is closer to a center of the substrate than the first conductive feature and the second conductive feature.

18. The apparatus of claim 12, wherein the third conductive feature is closer to a center of the substrate in a plan view than the first conductive feature and the second conductive feature.

19. The apparatus of claim 13, wherein the at least one of the plurality of conductive features having no stud bumps is closer the center of the semiconductor substrate in a plan view than the second subset of the at least some of the conductive features.

* * * * *